United States Patent
Mashimoto et al.

[11] Patent Number: 6,030,854
[45] Date of Patent: *Feb. 29, 2000

[54] METHOD FOR PRODUCING A MULTILAYER INTERCONNECTION STRUCTURE

[75] Inventors: Yohko Mashimoto; Shuji Inoue; Jiro Kubota; Mashahiro Kuroda, all of Ibaraki, Japan

[73] Assignee: Intel Corporation, Santa Clara, Calif.

[*] Notice: This patent issued on a continued prosecution application filed under 37 CFR 1.53(d), and is subject to the twenty year patent term provisions of 35 U.S.C. 154(a)(2).

[21] Appl. No.: 09/111,268

[22] Filed: Jul. 6, 1998

Related U.S. Application Data

[62] Division of application No. 08/625,797, Mar. 29, 1996, Pat. No. 5,880,530.

[51] Int. Cl.[7] .................................................. H01L 23/48
[52] U.S. Cl. ........................... 438/106; 438/127; 438/613
[58] Field of Search .................................. 438/613, 612, 438/126, 127, 106; 257/783, 778, 789, 795, 787, 772

[56] References Cited

U.S. PATENT DOCUMENTS

| | | | |
|---|---|---|---|
| 4,970,575 | 11/1990 | Soga et al. | 257/786 |
| 4,999,699 | 3/1991 | Christie et al. | 357/65 |
| 5,089,440 | 2/1992 | Christie et al. | 437/209 |
| 5,107,325 | 4/1992 | Nakayoshi | 357/69 |
| 5,121,190 | 6/1992 | Hsiao et al. | 357/80 |
| 5,143,785 | 9/1992 | Pujol et al. | 428/352 |
| 5,194,930 | 3/1993 | Papathomas et al. | 257/773 |
| 5,250,848 | 10/1993 | Christie et al. | 257/778 |
| 5,292,688 | 3/1994 | Hsiao et al. | 29/840 |
| 5,300,459 | 4/1994 | Ushikubo et al. | 438/126 |
| 5,407,864 | 4/1995 | Kim | 437/203 |
| 5,442,240 | 8/1995 | Mukerji | 257/783 |
| 5,468,790 | 11/1995 | Papathomas | 524/100 |
| 5,471,096 | 11/1995 | Papathomas et al. | 257/778 |
| 5,550,408 | 8/1996 | Kunitomo et al. | 257/737 |
| 5,567,654 | 10/1996 | Beilstein, Jr. et al. | 437/209 |
| 5,629,559 | 5/1997 | Miyahara | 257/666 |
| 5,894,173 | 4/1999 | Jacobs et al. | 257/790 |
| 5,907,190 | 5/1999 | Ishikawa et al. | 257/795 |

FOREIGN PATENT DOCUMENTS

| | | | |
|---|---|---|---|
| 59-151502 | 2/1986 | Japan | 257/795 |
| 64-310307 | 7/1991 | Japan | 257/795 |
| 3231435 | 11/1993 | Japan | 257/778 |
| 5315578 | 11/1993 | Japan | 257/777 |
| 6236981 | 8/1994 | Japan | 257/777 |
| 766326 | 3/1995 | Japan | 257/777 |

*Primary Examiner*—Donald L. Monin, Jr.
*Assistant Examiner*—Mike Dietrich
*Attorney, Agent, or Firm*—Blakely, Sokoloff, Taylor & Zafman LLP

[57] ABSTRACT

An apparatus and method for forming solder interconnection structures that reduce thermo-mechanical stresses at the solder joints of a semiconductor device and its supporting substrate. In one embodiment, the solder interconnection structure of the present invention comprises a semiconductor device and a substrate having a plurality of solder connections extending from the substrate to electrodes or bond pads on the semiconductor device. A multilayer structure is disposed between the semiconductor device and substrate filling the gap formed by the solder connections. The multilayer structure includes a first layer and a second layer, each having a different coefficient of thermal expansion. Thus, in accordance with the present invention, the stress concentration points are moved away from the solder joints of the semiconductor device and substrate to a point located between the first and second layers of the filler structure.

19 Claims, 8 Drawing Sheets

METHOD FOR PRODUCING A MULTILAYER INTERCONNECTION STRUCTURE

This is a divisional of application No. 08/625,797, filed Mar. 29, 1996, now U.S. Pat. No. 5,880,530.

FIELD OF THE INVENTION

The invention relates to interconnection structures for joining an integrated semiconductor device to an organic substrate and, more particularly, to a structure for reducing thermal and mechanical stresses at the solder joints connecting the semiconductor device and substrate.

BACKGROUND OF THE INVENTION

Controlled collapse chip connection (C4) or flip-chip technology is used for interconnecting high input/output semiconductor devices to substrates via an array of solder bumps. The solder bumps typically comprise a Pb/Sn alloy and are connected to the semiconductor device and substrate at solder joinable contact pads. In many instances, the semiconductor devices are connected to substrates made of materials with coefficients of thermal expansion that differ from the coefficient of thermal expansion of the material of the semiconductor device. Normally the semiconductor device is formed of monocrystalline silicon with a coefficient of thermal expansion of $2.5-3.5 \times 10^{-6}$ per ° C. The organic substrate is usually formed of polymer impregnated fiberglass having a coefficient of thermal expansion of $30-40 \times 10^{-6}$ per ° C. In operation, the active and passive elements of the semiconductor device generate heat resulting in temperature fluctuations in both the semiconductor device and the supporting substrate since the heat is conducted through the solder bonds. The semiconductor device and substrate thus expand and contract in different amounts with temperature fluctuations due to the different coefficients of thermal expansion. This imposes both shear and bending stresses along the solder terminals/pads.

The stress on the solder bonds during operation is directly proportional to (1) the magnitude of the temperature fluctuations, (2) the difference in the coefficients in expansion of the material of the semiconductor device and the substrate and (3) the distance of an individual bond from the neutral or central point of the device. In addition, solder bond stresses are inversely proportional to the height of the solder bond, that is the spacing between the semiconductor device and the substrate. The problems associated with stresses at the solder/bond pad interfaces are further compounded by the fact that as solder terminals become smaller in diameter in order to accommodate the need for greater density, the overall height decreases. Due to the flexible nature of organic substrates, including those that are fiber reinforced, the substrates tend to warp or bend during processing and temperature fluctuations. This greatly magnifies the problems associated with the destructive stress forces that are placed upon a solder joint between a substrate and a semiconductor device.

FIG. 1A illustrates a typical prior art solder interconnecting structure 10 between a semiconductor device 12 and substrate 14. Device 12 and substrate 14 are electrically coupled by C4 type solder connections 16 that are joined to solder wettable pads 18 on the semiconductor device and to corresponding solder wettable pads 20 on the substrate. The interconnection structure 10 generally comprises a single-layer, epoxy base material commonly known as a "filler".

As mentioned earlier, in prior art solder interconnection structures there are many problems associated with the formation of shear and bending stresses at the solder/bond pad interfaces. These stresses are generally attributable to the difference in the coefficients of thermal expansion of the semiconductor and substrate materials. FIG. 1B illustrates a typical stress distribution 26 generated by shear forces (F) acting upon the apparatus of FIG. 1A due to the thermal expansion of substrate 14 relative to semiconductor device 12. FIG. 1C illustrates a typical bending stress distribution 28 generated by moment forces (M) acting on the apparatus of FIG. 1A due to the thermal expansion of substrate 14 relative to semiconductor device 12. As shown, the maximum shear and bending stresses acting upon the structure are concentrated at or near the facing surfaces 22 and 24 of semiconductor device 12 and substrate 14. More importantly, it is important to note that the stresses tend to concentrate along the interfaces between solder connection 16 and bond pads 18 and 20. This is especially problematic since the adhesion forces within the interconnect structure 10 are typically at a minimum along the solder connection and bond pad interfaces. The thermo-mechanical stress conditions found at the solder and bond pad interfaces will often cause cracks to form along the interfaces which eventually promulgate into the solder connections 16. As a result, the quality and reliability of the electrical connection between device 12 and substrate 14 is greatly reduced. This can often cause a device to fail resulting in lower manufacturing yields which can be very costly. Moreover, such thermo-mechanical stresses reduce the life and stability of the solder bond joints.

What is needed then is a solder interconnection structure which solves the aforementioned problems associated with concentrated stresses at the solder bond joints of semiconductor devices and their supporting substrates. As will be seen, the present invention provides a solder interconnection structure that reduces the stress concentrations at the solder connection and bond pad interfaces and, thus enhances the reliability of the electrical connection between a semiconductor device and supporting substrate.

SUMMARY OF THE INVENTION

The present invention is directed at providing an apparatus and method for forming solder interconnection structures that reduce stresses at the solder joints of a semiconductor device at its supporting substrate.

In one embodiment, the solder interconnection structure of the present invention comprises a semiconductor device and a substrate having a plurality of solder connections extending from the substrate to electrodes or bond pads on the semiconductor device. A multilayer structure is disposed between the semiconductor device and substrate filling the gap formed by the solder connections. The multilayer structure includes a plurality of filler layers wherein each adjoining layer possesses a different coefficient of thermal expansion.

The present invention also includes a method for forming a multilayer interconnection structure between a semiconductor device and substrate that are connected by a plurality of solder connections. The method includes attaching a semiconductor device to a substrate by a plurality of solder connections that extend from the substrate to electrodes or solder pads on the semiconductor device. The gap formed by the solder connections is then filled with a filler comprising a first material containing suspended particles of a second material having a coefficient of thermal expansion that is different than the coefficient of thermal expansion of the first material. The filler is then heated for a period of time such that a substantial portion, or all, of said particles subside in a lower region of the filler.

BRIEF DESCRIPTION OF THE DRAWINGS

The present invention is illustrated by way of example and is not limited by the figures of the accompanying drawings, in which like references indicate similar elements, and in which.

DETAILED DESCRIPTION

An apparatus and method for forming solder interconnection structures that reduce stresses at the solder joints of a semiconductor device and its supporting substrate is described. In the following description, numerous specific details are set forth such as material types, dimensions, processing steps, etc., in order to provide a thorough understanding of the present invention. However, it will be obvious to one of skill in the art that the invention may be practiced without these specific details. In other instances, well known elements and processing techniques have not been shown in particular detail in order to avoid unnecessarily obscuring the present invention.

Figure 1A:
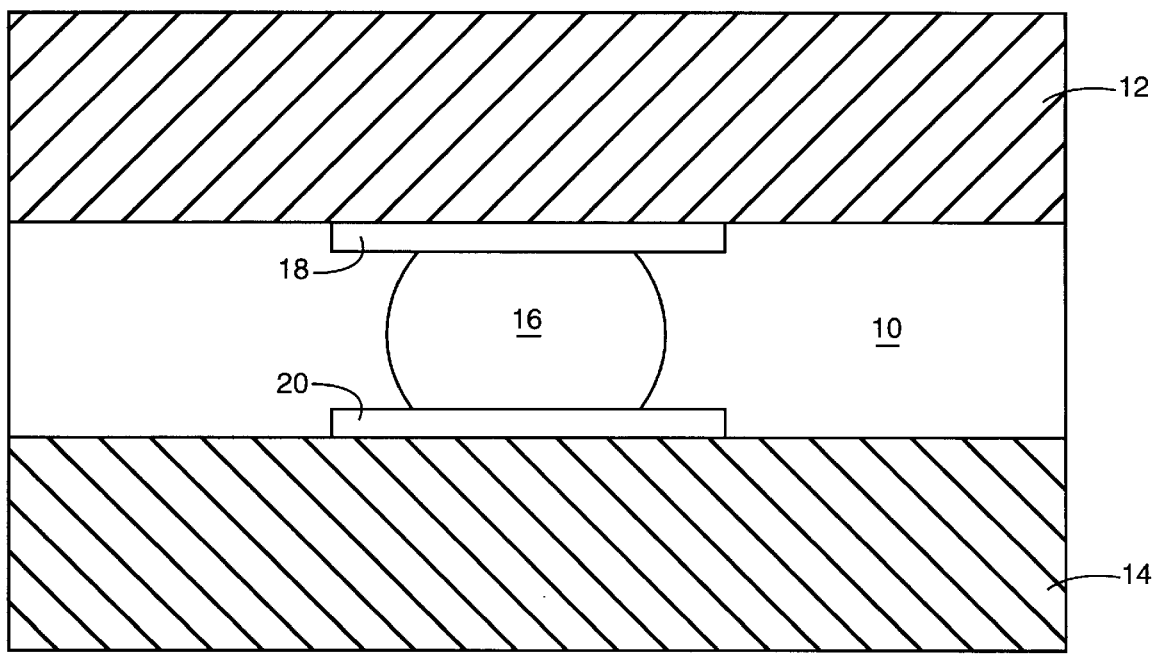
FIG. 1A illustrates a prior art solder interconnection structure.
Figure 1B:
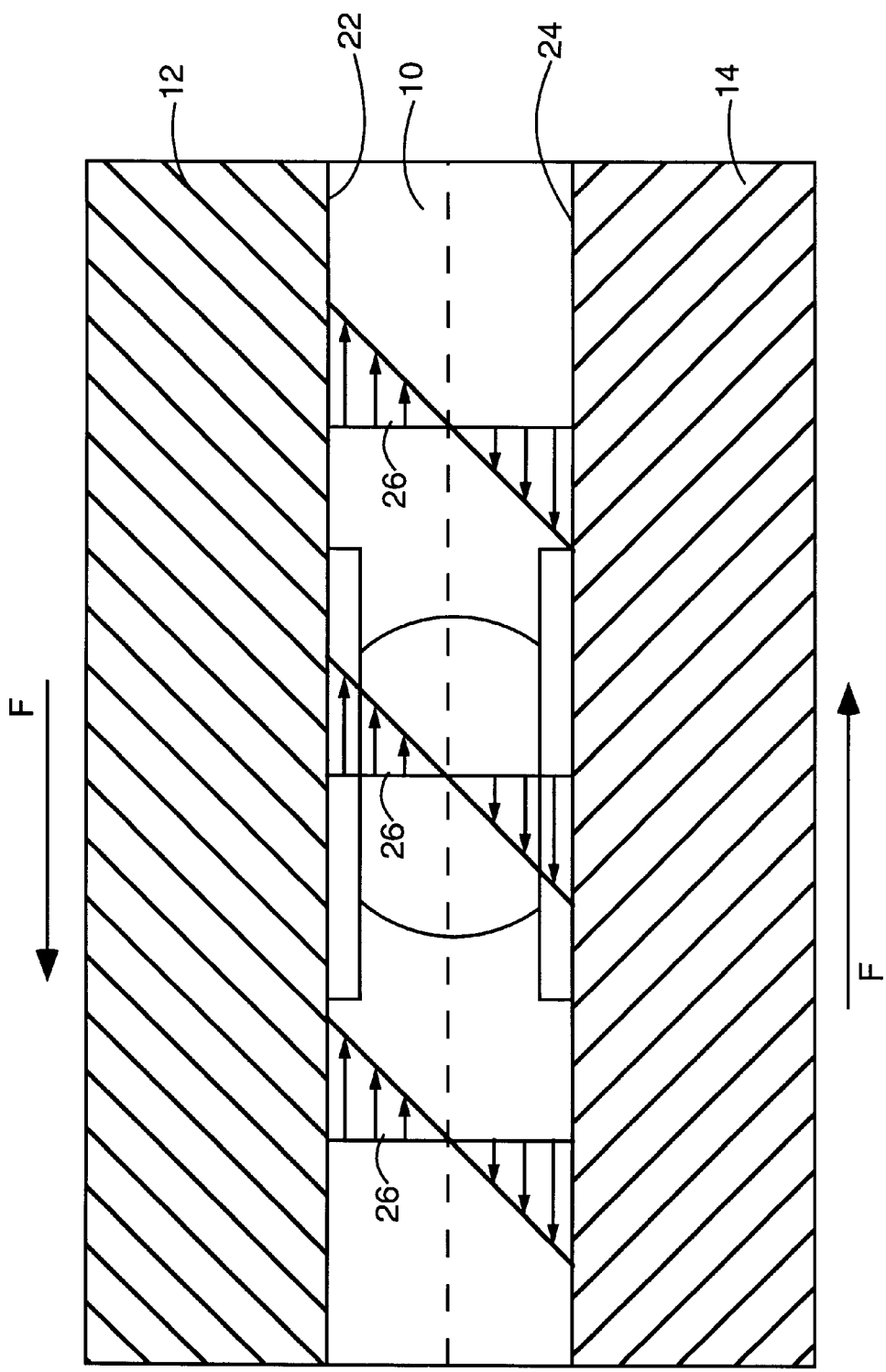
FIG. 1B illustrates a typical stress distribution generated by a pure shear force acting upon the apparatus of FIG. 1A.
Figure 1C:
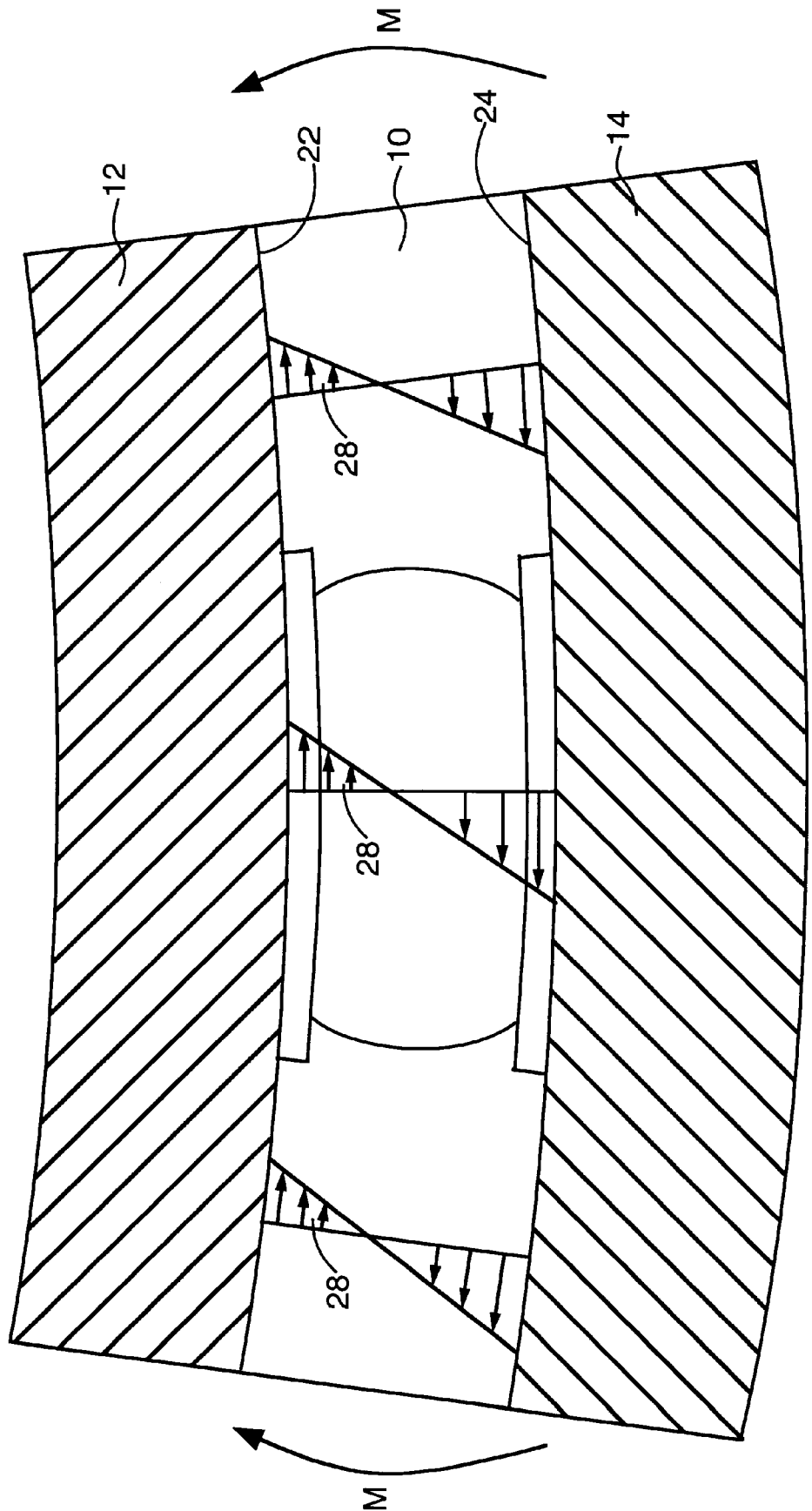
FIG. 1C illustrates a typical stress distribution generated by a moment force acting upon the apparatus of FIG. 1A.
Figure 2A:
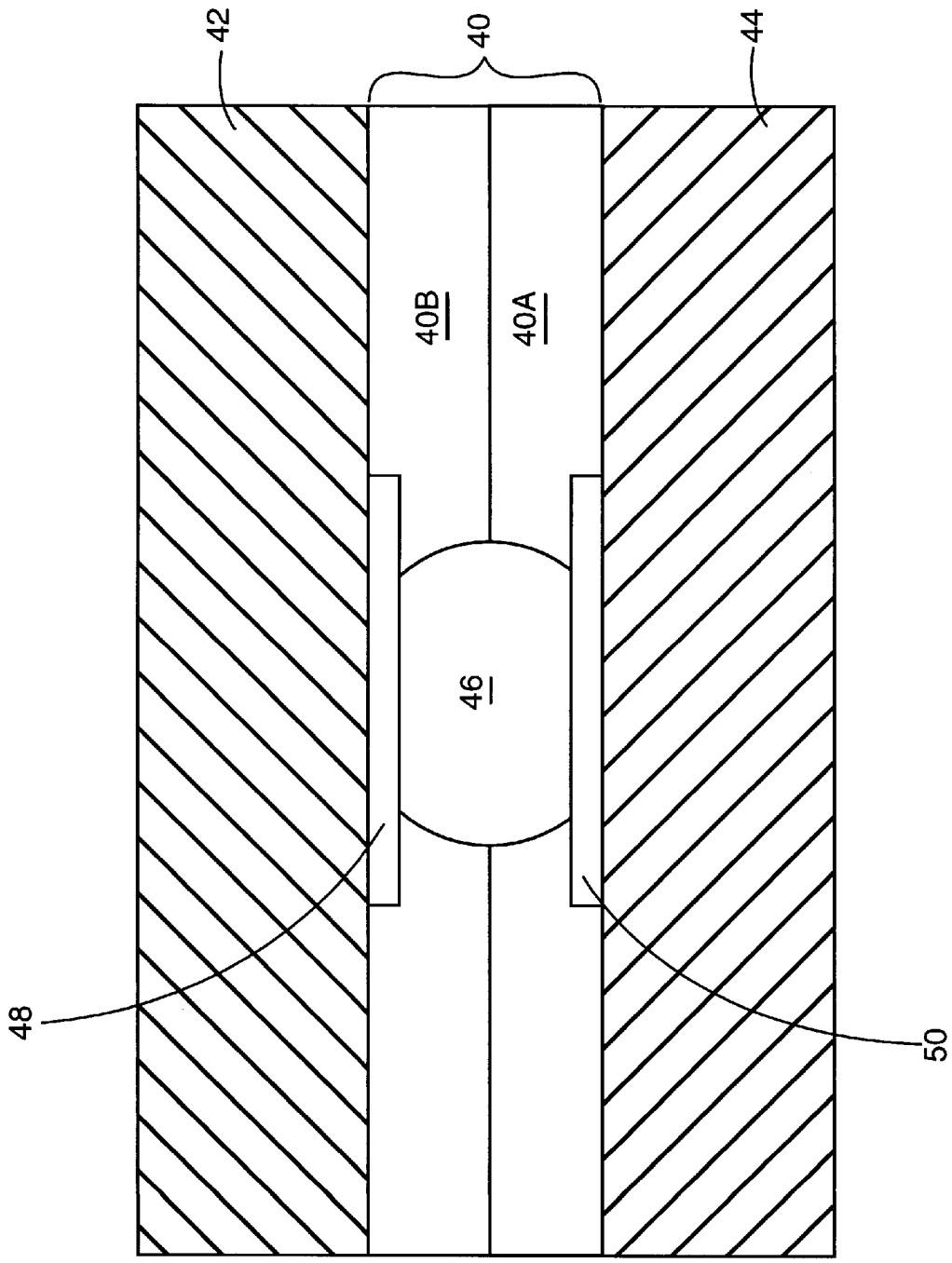
FIG. 2A illustrates a solder interconnection structure in one embodiment of the present invention.

FIG. 2A shows a cross-sectional view of a solder interconnection structure 40 of one embodiment of the present invention. Note that a single solder connection is depicted in FIG. 2A in order to clearly illustrate the features and benefits of the present invention. It is appreciated, however, that the present invention is aimed at applications employing a multitude of solder connections. The present invention is particularly applicable to interconnection structures employing C4 or flip-chip technology to connect semiconductor devices to organic substrates.

As shown in FIG. 2A, a semiconductor device 42 is joined to a substrate 44 by a solder connection 46 at pads 48 and 50. Semiconductor device 42 is typically formed of monocrystalline silicon with a coefficient of thermal expansion in the range of approximately $2.5-3.5 \times 10^{-6}$ per ° C. Substrate 44 generally comprises an organic material with a coefficient of thermal expansion in the range of approximately $30-40 \times 10^{-6}$ per ° C. As noted earlier, the semiconductor device and substrate expand and contract in different amounts with temperature fluctuations due to the different coefficients of thermal expansion. Since the coefficients of thermal expansion vary greatly between silicon semiconductor devices and organic substrates, large shear and bending stresses are produced during temperature fluctuations. In prior art single-layer interconnection structures these stresses concentrate at or near the solder bond joints/pads causing cracks to form at the solder bond joint and within the solder bond connection itself. The present invention addresses the problem associated with concentrated stresses at the solder bond joints by providing a multilayer interconnection structure.

Figure 2B:
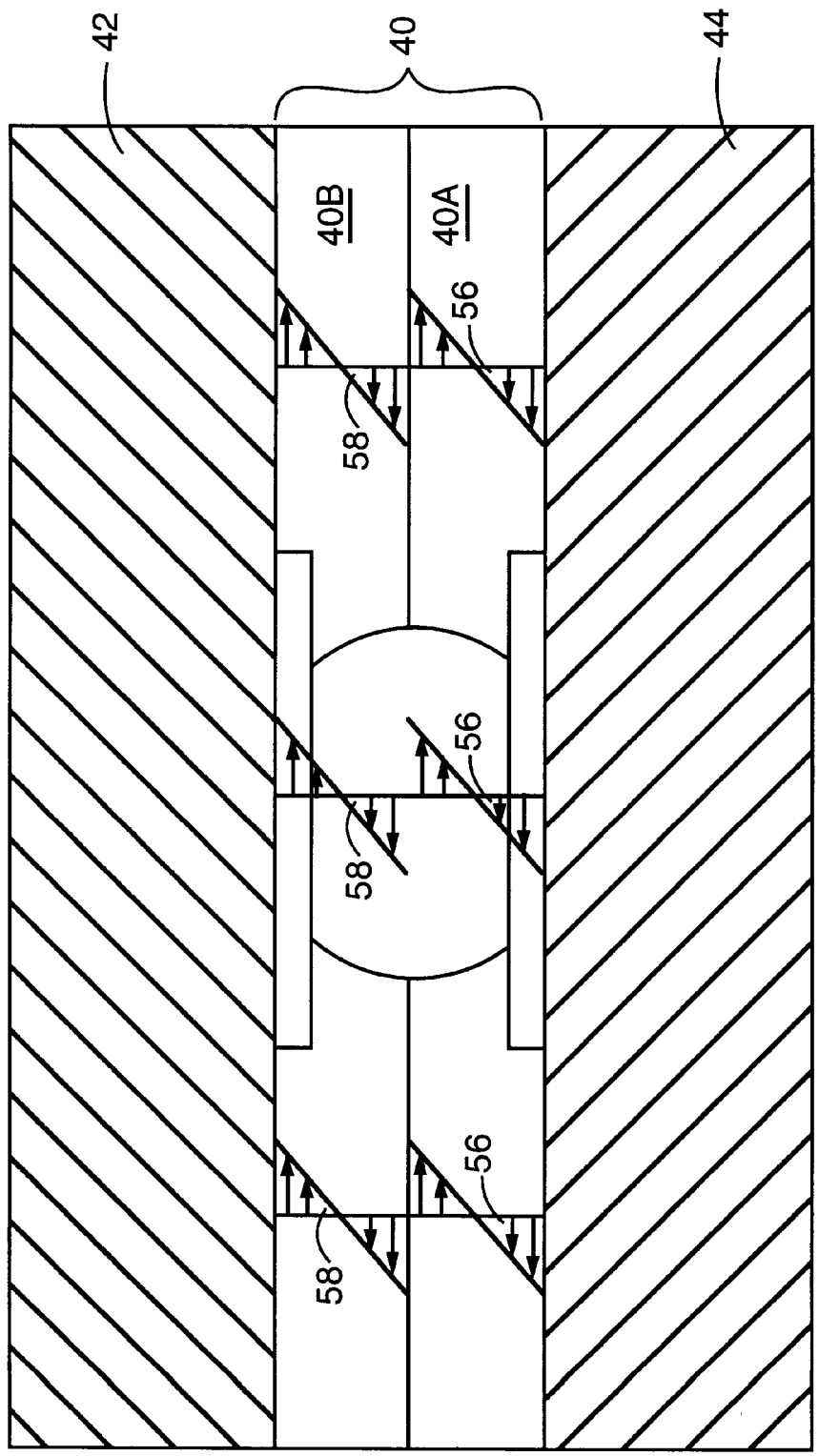
FIG. 2B illustrates the stress distribution generated by a pure shear force acting upon the apparatus of FIG. 2A.
Figure 2C:
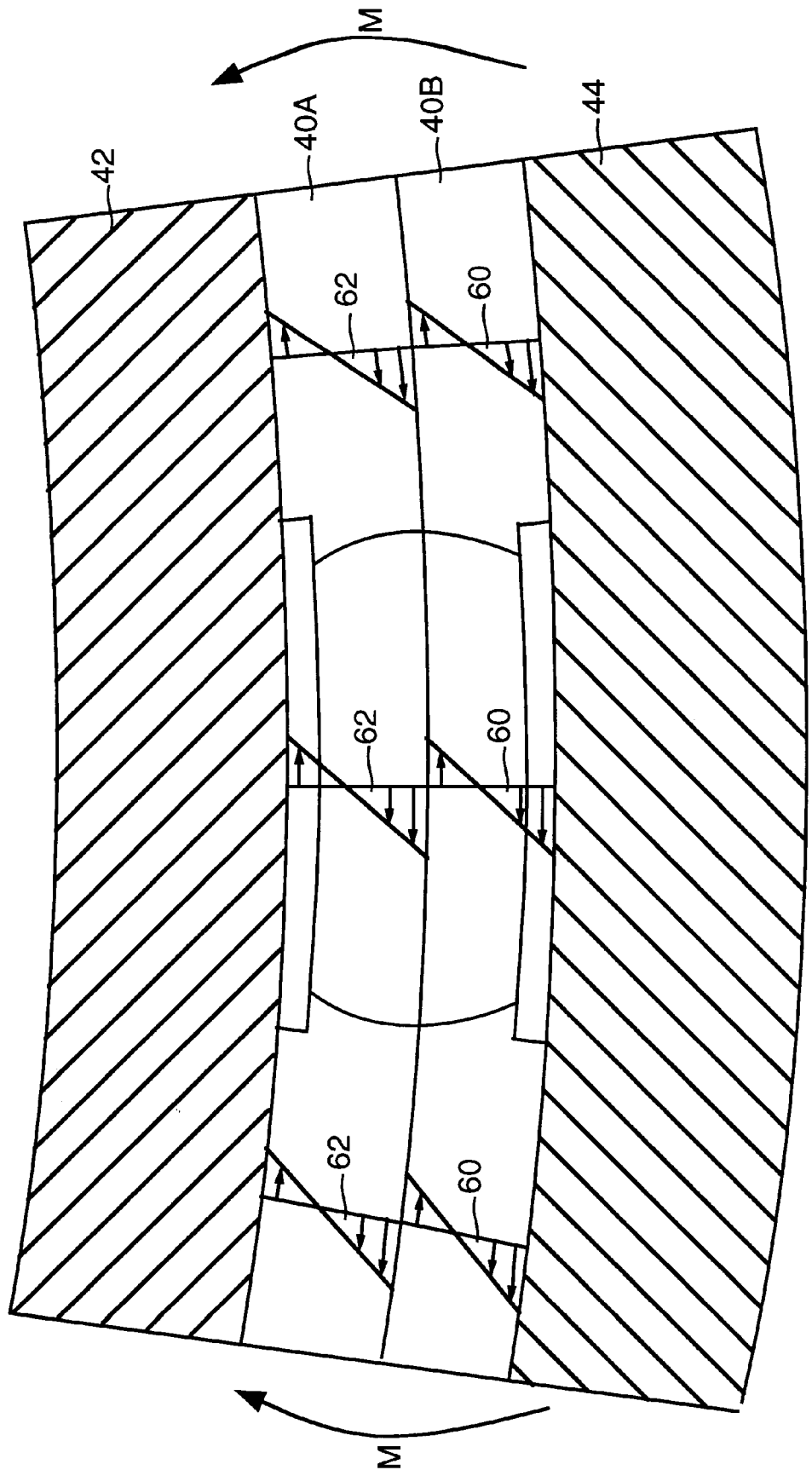
FIG. 2C illustrates the stress distribution generated by a moment force acting upon the apparatus of FIG. 2A.

As shown in FIG. 2A, in one embodiment interconnection structure 40 is divided into two regions or layers 40A and 40B. In accordance with the present invention, layers 40A and 40B of structure 40 each possess a different coefficient of thermal expansion. In one embodiment, layer 40B has a coefficient of thermal expansion that is greater than the coefficient of thermal expansion of layer 40A. By providing a multilayer solder interconnection structure wherein each adjoining layer possesses a different coefficient of thermal expansion, the present invention reduces the stresses at the semiconductor device and substrate solder connection joints. Stress reduction at the solder joints is accomplished by controlling the location of the stress concentration points within the structure. As shown in FIGS. 2B and 2C, by introducing an interconnection structure that is divided into two regions having different coefficients of thermal expansion, the stress concentration points are moved away from the solder bond joints. As a result, the shear and bending stresses near the solder connection interfaces are reduced as illustrated by stress distribution diagrams 56, 58, 60 and 62.

Figure 2D:
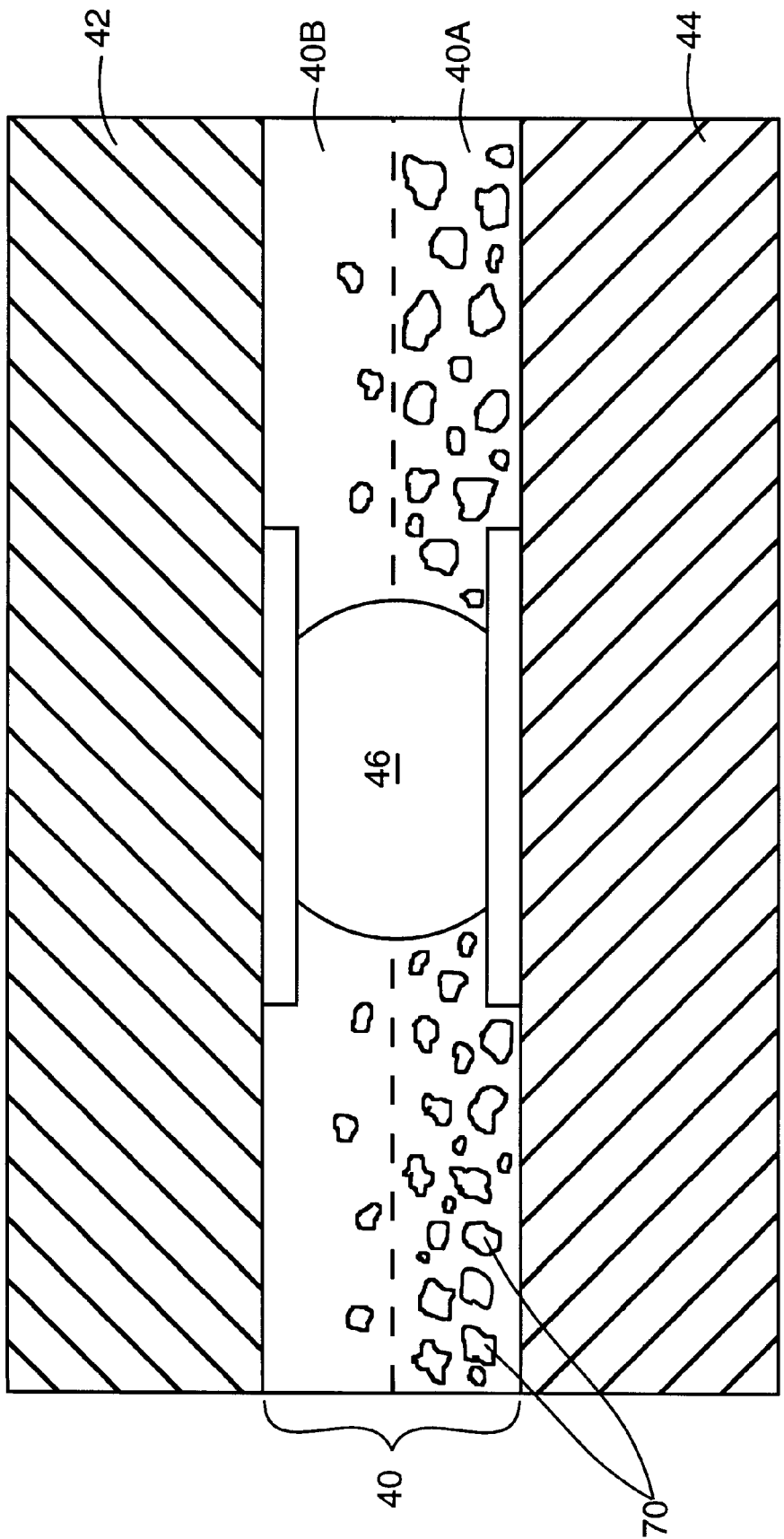
FIG. 2D shows the suspended particles in the solder interconnection of FIG. 2A.

The composition of layers 40A and 40B may vary depending upon the particular application. In most instances, however, it is desirable to maximize the difference in the coefficients of thermal expansion between the two layers in order to maximize the stress reduction at the semiconductor device and substrate solder connection joints. As an example, the filler material employed pursuant to the present invention may include an epoxy base filler that contains particles of a material having a coefficient of thermal expansion that is different than that of the epoxy base material. In one embodiment, the filler comprises an epoxy-silica composition, Type X-43-5230-3, manufactured by Shinetsu. The filler contains silica particles in the range of about 60–70% by weight. The epoxy base material possesses a coefficient of thermal expansion of approximately $65 \times 10^{-6}$ per ° C. whereas the silica particles have a coefficient of thermal expansion of about $3.0 \times 10^{-6}$ per ° C. Layers 40A and 40B of interconnection structure 40 are formed by dispensing a liquid epoxy filler containing silica particles into the gap between device 42 and substrate 44. The filler may be dispensed through a nozzle, syringe, or other device under pressure of about 15–50 p.s.i. and a temperature of about 90° C. Disperse and flow conditions are preferably selected such that the filler completely fills the gap between the device 42 and substrate 44. Fillers containing relatively small particle sizes are necessary so that the composite epoxy material will readily flow in the gap between semiconductor device 42 and substrate 44 to fully encapsulate solder connections 46. After the gap is filled with the epoxy-silica filler, the composition is precured at a temperature of approximately 120° C. for about one minute. During the curing process a force, such as gravity, acts upon the filler composition causing the silica particles to subside to form layers 40A and 40B. As illustrated in FIG. 2D, once the precuring process is complete, nearly all of the silica particles 70 reside within the lower region of structure 40 in layer 40A. A small percentage of silica particles may reside in layer 40B. In one embodiment, layer 40A contains silica in the range of approximately 50% to 60% by weight and layer 40B contains silica in the range of approximately 5% to 10% by weight, respectively. The cured compositions of layers 40A and 40B have coefficients of thermal expansion of about 25×10⁻⁶ per ° C. and 60×10⁻⁶ per ° C., respectively. It is appreciated that the composition of layers 40A and 40B may be varied in a number of ways. One method is to vary the percent weight composition of silica in the epoxy base material. The composition of layers 40A and 40B can also be controlled by varying the temperature and amount of pre-mixing of the filler before it is dispensed into the gap between semiconductor device 42 and substrate 44. The curing temperature and time may also be adjusted to obtain a desired composition. The epoxy compositions used in the present invention may also include suitable hardening agents, catalysts, dyes, etc. as are well known in the art.

Additional curing steps may be performed after the formation of layers 40A and 40B. For example, in one embodiment, semiconductor device 42, substrate 44 and interconnection structure 40 are cured at a temperature of approximately 150° C. for about 5 hours after the precuring process is complete.

Figure 3:
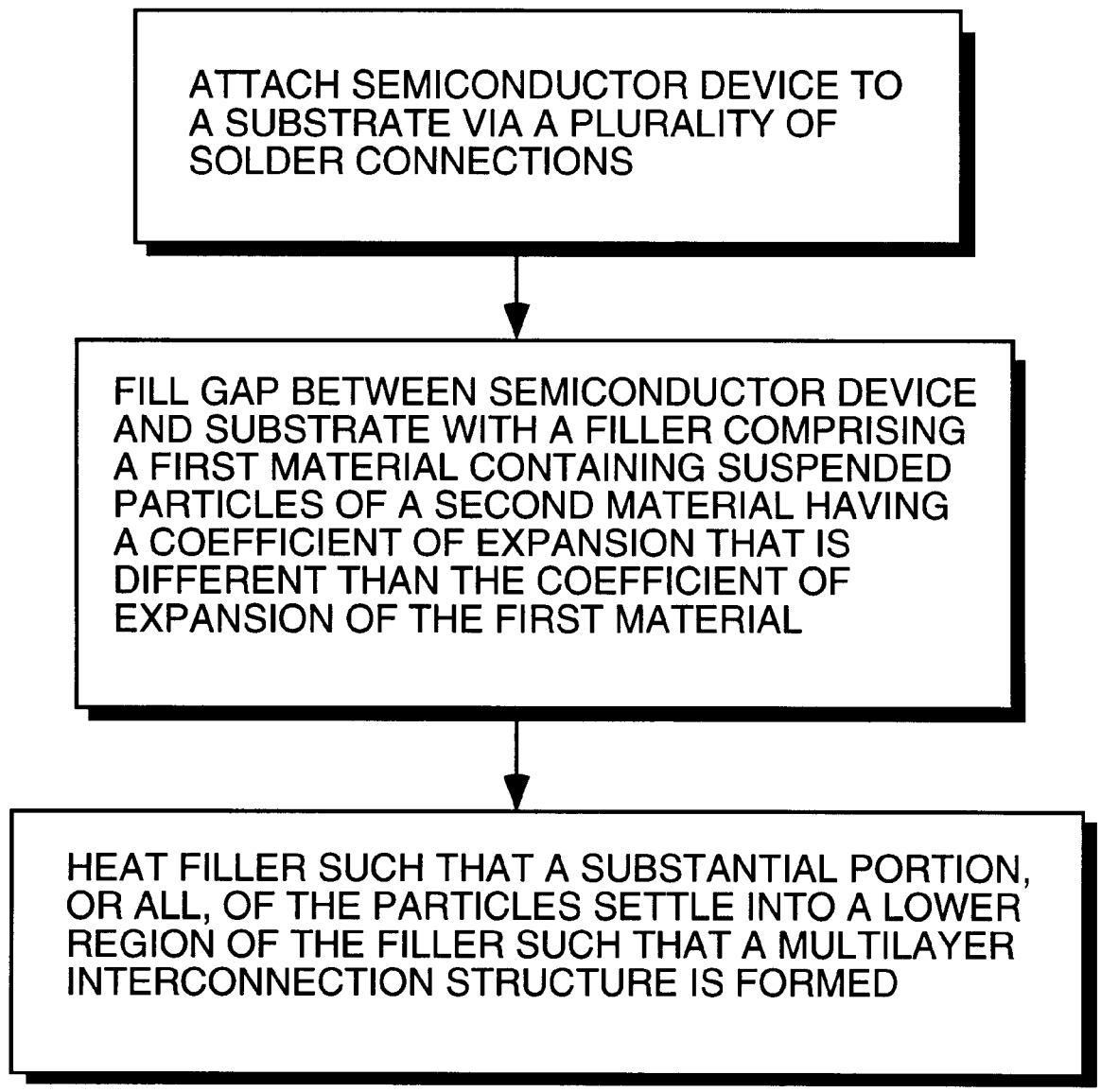
FIG. 3 illustrates a flow chart of one embodiment of the present invention.

FIG. 3 illustrates a flow chart for forming an interconnection structure in one embodiment of the present invention.

Although an interconnection structure comprising an epoxy containing silica particles has been described, it is important to note that any of a number of other additives may be used in lieu of silica. For example, organic particles similar to those used to manufacture substrates may be used. These may include polymer impregnated fiberglass particles. Further, it is contemplated that filler materials other than epoxy based materials may be used to form the interconnection structure. Moreover, it is important to note that the present invention is not limited to a two-layer interconnection structure. The implementation of the present invention only requires the formation of a multilayer solder interconnection structure wherein adjoining layers possess different coefficients of thermal expansion.

It is appreciated that the methods and apparatus of the present invention may be used in other technologies to form electrical and/or mechanical connections between other types of electronic devices. It is further understood that the relative dimensions, geometric shapes, materials and process parameters set forth within the specification are exemplary of the disclosed embodiments only. Other embodiments may utilize different dimensions, shapes, materials, and process settings, etc., to achieve substantially the same results.

What is claimed is:

1. A method of providing a solder interconnection between a semiconductor device and a substrate comprising the steps of:
   a) attaching said semiconductor device to said substrate by a plurality of solder connections that extend from said substrate to pads on said semiconductor device to form a gap between said substrate and said semiconductor device, said gap comprising an upper region located adjacent to said semiconductor device and a lower region located adjacent to said substrate;
   b) filling said gap with a filler comprising a first material containing suspended particles of a second material having a coefficient of thermal expansion that is different than the coefficient of thermal expansion of said first material; and
   c) heating said filler for a period of time such that a substantial portion or all of said particles subside in said lower region of said filler, such that said lower region has a coefficient of thermal expansion different than the coefficient of thermal expansion of said upper region.

2. The method of claim 1 further comprising the step of curing said semiconductor device, said substrate and said filler.

3. The method of claim 2 wherein said curing step is performed at a temperature of approximately 150° C. for a period of approximately 5 hours.

4. The method of claim 1 wherein said heating step is performed at a temperature in the range of approximately 120° C. plus or minus 10° C.

5. The method of claim 4 wherein said heating step is performed for approximately one minute.

6. The method of claim 1 wherein said first material comprises an epoxy material.

7. The method of claim 1 wherein said second material comprises silica.

8. The method of claim 1 wherein said second material comprises polymer impregnated fiberglass particles.

9. The method of claim 1 wherein the coefficient of thermal expansion of said first material is substantially larger than the coefficient of thermal expansion of said second material.

10. The method of claim 1 wherein the amount of said second material in said filler is approximately 60–70 percent by weight.

11. A method of providing a solder interconnection between a semiconductor device and a substrate comprising the steps of:
    a) attaching said semiconductor device to said substrate by a plurality of solder connections that extend from said substrate to pads on said semiconductor device to form a gap between said substrate and said semiconductor device;
    b) filling said gap with a composition comprising an epoxy containing particles of a material having a coefficient of thermal expansion that is different than the coefficient of thermal expansion of said epoxy; and
    c) heating said filler for a period of time such that a substantial portion or all of said particles subside in a lower region of said composition, such that said lower region has a coefficient of thermal expansion different than the coefficient of thermal expansion of an upper region of said composition.

12. The method of claim 11 further comprising the step of curing said semiconductor device, said substrate and said filler.

13. The method of claim 12 wherein said curing step is performed at a temperature of approximately 150° C. for a period of approximately 5 hours.

14. The method of claim 11 wherein said heating step is performed at a temperature in the range of approximately 120° C. plus or minus 10° C.

15. The method of claim 14 wherein said heating step is performed for approximately one minute.

16. The method of claim 11 wherein said material comprises silica.

17. The method of claim 11 wherein said material comprises polymer impregnated fiberglass particles.

18. The method of claim 11 wherein the coefficient of thermal expansion of said material is substantially lower than the coefficient of thermal expansion of said epoxy.

19. The method of claim 11 wherein the amount of said material in said composition is approximately 60–70 percent by weight.

* * * * *